(12) United States Patent
Wen et al.

(10) Patent No.: US 6,767,792 B1
(45) Date of Patent: Jul. 27, 2004

(54) FABRICATION METHOD FOR FORMING FLASH MEMORY DEVICE PROVIDED WITH ADJUSTABLE SHARP END STRUCTURE OF THE L-SHAPED FLOATING GATE

(75) Inventors: Wen-Ying Wen, Hsinchu (TW); Jyh-Long Horng, Hsinchu (TW); Erik S. Jeng, Hsinchu (TW); Bai-Jun Kuo, Hsinchu (TW); Chih-Hsueh Hung, Hsinchu (TW)

(73) Assignee: Megawin Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/389,944

(22) Filed: Mar. 18, 2003

(51) Int. Cl.[7] .............................................. H01L 21/336
(52) U.S. Cl. ...................................................... 438/257
(58) Field of Search ................................ 438/257–267; 257/314–320, E29.3, E29.129, E29.304, E21.68, E21.179, E21.422, E21.687, E21.688

(56) References Cited

U.S. PATENT DOCUMENTS 6,518,110 B2 * 2/2003 Wen ............................ 438/201
6,537,880 B1 * 3/2003 Tseng .......................... 438/260

* cited by examiner

*Primary Examiner*—W. David Coleman
*Assistant Examiner*—Brook Kebede
(74) *Attorney, Agent, or Firm*—Rosenberg, Klein & Lee

(57) ABSTRACT

The present invention generally relates to provide a fabrication method for forming a flash memory device provided with an adjustable sharp end structure of the floating gate. While the present invention utilizes the dielectric spacer to form the L-shaped floating gate provided with a sharp end structure, the present invention adjust the thickness of the polysilicon layer and the dielectric layer covering on the polysilicon layer surface to adjust the position of the dielectric spacer so as to change the position of the sharp end structure of the L-shaped floating gate and to enhance the ability of erasing control of the flash memory and to simultaneously form a stable and easily controlled channel length and the sharp end structure for point discharging.

11 Claims, 4 Drawing Sheets

FABRICATION METHOD FOR FORMING FLASH MEMORY DEVICE PROVIDED WITH ADJUSTABLE SHARP END STRUCTURE OF THE L-SHAPED FLOATING GATE

BACKGROUND OF THE INVENTION

1. Field of the Invention

The present invention generally relates to a semiconductor process, and more particularly relates to a fabrication method for forming a flash memory device, which is provided with an adjustable sharp end structure of the floating gate, in the semiconductor process.

2. Description of the Prior Art

In view of the prior semiconductor, first, a spacer structure is usually formed on a semiconductor substrate so as to utilize the spacer structure to define the channel length. However, the fabrication method has the disadvantage of the difficult control of the spacer profile and cannot precisely control the ion implanting position of the source and the drain resulting in the disadvantage of the difficult control of the channel length.

The spacer can further be used as the floating gate of the flash memory except for defining the channel length. Such as the U.S. Pat. No. 5,427,968 is disclosed a fabrication method for forming a split gate flash memory with a separated and self-aligned tunneling regions. The fabrication method for forming the split gate flash memory utilizing the polysilicon spacer as the floating gate has the disadvantages of the difficult control of the spacer profile and length because of the little difference of the process parameters and elements, so the channel length of the memory is difficultly controlled.

Besides, the operation method of the flash memory is using the technology of injecting in or erasing electric charge from the floating gate. At the data-erasing step, the floating gate of the polysilicon spacer requires a sharp end to point discharge so as to erase the electric charge via the tunneling effect of the Fowler-Nordheim tunneling (F-N tunneling) technology to achieve the purpose of erasing the data. However, the floating gate of the spacer of the US patent mentioned above does not provide with a good sharp end structure, so the effect of point discharging is limited when it performs the data-erasing step. The control gate should completely cover the sharp end structure of the floating gate for advantageous for data erasing. However, in the formulation of the control gate on the floating gate of the spacer of the prior process, the process window is narrower so as to easily make the control gate not completely covering the sharp end structure and the prior process could not control or adjust the position of the sharp end structure and the relative position between the control gate and the sharp end structure.

Obviously, the main spirit of the present invention is to provide a fabrication method for forming a flash memory device provided with an adjustable sharp end structure of the floating gate, and then some disadvantages of well-known technology are overcome.

SUMMARY OF THE INVENTION

The primary object of the present invention is to provide a fabrication method for forming a flash memory device provided with an adjustable position of the sharp end structure of the floating gate. The present invention can control the position of the sharp end structure to improve the size of the process window and the control gate can easily completely cover the sharp end structure of the floating gate so as to enhance the ability of erasing control of the flash memory.

Another object of the present invention is to provide a fabrication method for forming a flash memory device provided with an adjustable sharp end structure of the floating gate. The present invention can manufacture stable and easily controlled channel length, the sharp end structure for point discharging, and can achieve the repeatedly control of the fabrication of the semiconductor devices.

In order to achieve previous objects, the present invention is sequentially formed a defined patterned first dielectric layer, a polysilicon layer, and a second dielectric layer on a semiconductor substrate provided with a gate oxide layer thereon. Following, the second dielectric layer is etched to form a dielectric spacer at a salient residual portion of the polysilicon layer of the second dielectric layer, wherein a position of the dielectric spacer is changeable via adjusting a thickness of the second dielectric layer. Last, using the dielectric spacer as a mask to etch the polysilicon layer can form a polysilicon spacer with a sharp end structure at two sides of the first dielectric layer, wherein the polysilicon spacer is used as a floating gate and a position of the salient sharp end structure is depending on a position of the dielectric spacer.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a fabrication method for forming a flash memory device provided with an adjustable sharp end structure of the floating gate. Additionally, the present invention utilizes the adjustability of the thickness of the polysilicon layer and the dielectric layer covering on the polysilicon layer surface to change the position of the sharp end structure of the L-shaped floating gate and to enhance the ability of erasing control of the flash memory.

Referring to the FIG. 1, FIG. 2, FIG. 3, FIG. 4, and FIG. 5, there are schematic representations structures at various stages to detailed illustrate the formulation of a flash memory device of the present invention. The fabrication method of the present invention comprises following steps. First, such as shown in the FIG. 1, a gate oxide layer 12 is depositing on a surface of a semiconductor substrate 10, which is made of silicon material. Then, using a patterned photoresist as a mask to form a defined patterned dielectric layer 14 on a surface of the gate oxide layer 12 by utilizing the lithography process.

Figure 1:
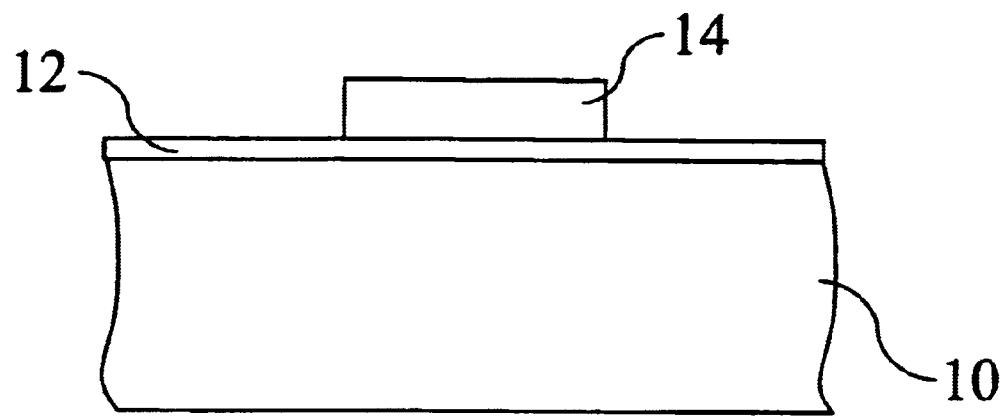
FIG. 1, FIG. 2, FIG. 3, FIG. 4, FIG. 5, and FIG. 6 are schematic representations structures at various stages during the formulation of flash memory device, in accordance with the present invention.
Figure 2:
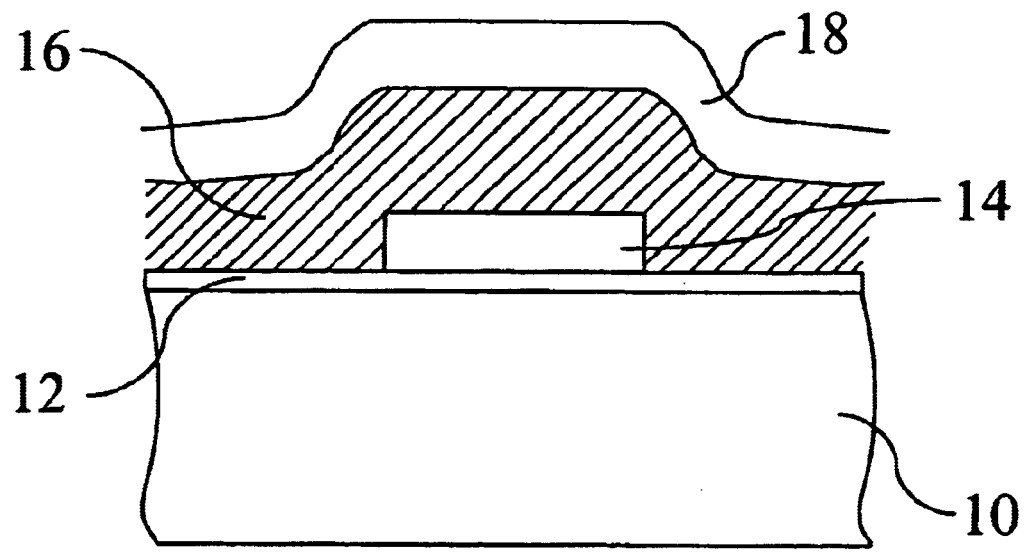
Figure 3:
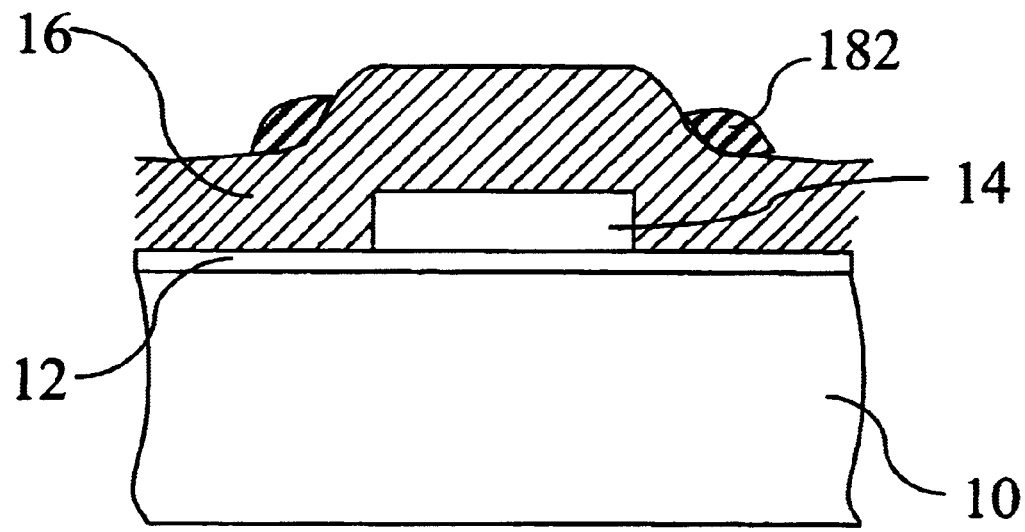

Following those steps, and referring to the FIG. 2, a polysilicon layer 16 is deposited on the semiconductor substrate 10 to cover the first dielectric layer 14 and the exposed surface of the gate oxide layer 12. Then, a second dielectric layer 18 is deposited on the semiconductor substrate 10. Referring to the FIG. 3, an etching process is carried out on the second dielectric layer 18. Owing to a region of the polysilicon layer 16 having raised portion overlaying the first dielectric layer 14, most of the second dielectric layer 18 is etched and removed by the etching step and only the portions of the second dielectric layer 18 on the sloped sidewalls of the raised or salient portion of the polysilicon layer 16 remain to form a pair of dielectric spacers 182. Wherein, the position of the dielectric spacers 182 relative to sidewall portions of the first dielectric layer 14 can be changed by adjusting the deposition thickness of the second dielectric layer 18.

Figure 4:
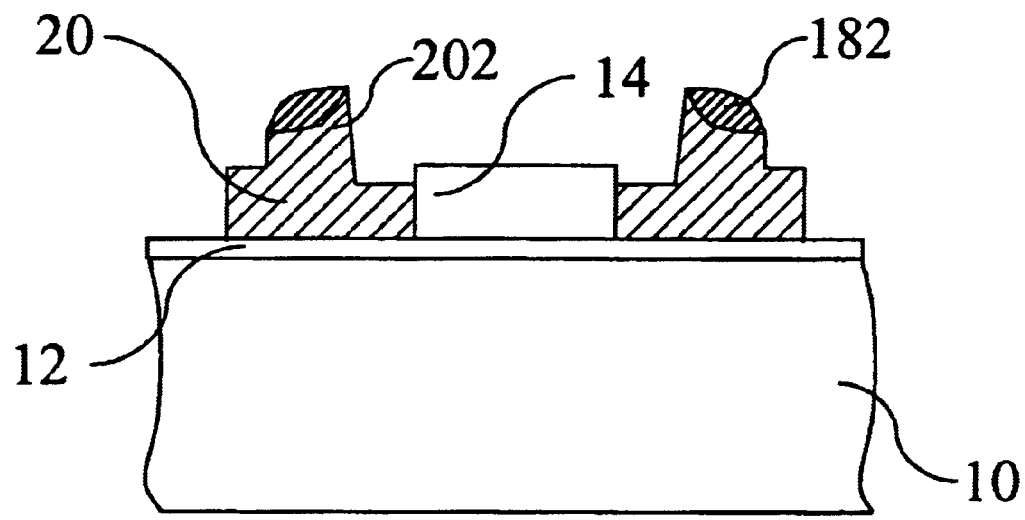

Referring to the FIG. 4, using the dielectric spacer 182 as a mask and utilizing an anisotropic etching process to etch the polysilicon layer 16 and form a polysilicon spacer 20 with a sharp end structure 202 at two sides of the first dielectric layer 14, wherein the polysilicon spacer 202 is used as a floating gate. The position of the salient sharp end structure 202 is dependent on the position of the corresponding dielectric spacer 182. Lastly, referring to FIG. 5, the dielectric spacer 182 and the first dielectric layer 14 are removed to obtain a floating gate 20 structure provided with the sharp end structure 202.

The first dielectric layer 14 and the second dielectric layer 18 can be made of the same material or of different materials. The first dielectric layer 14 and the second dielectric layer 18 can be made of a material selected from oxides, nitrides, and other dielectric materials.

Figure 6:
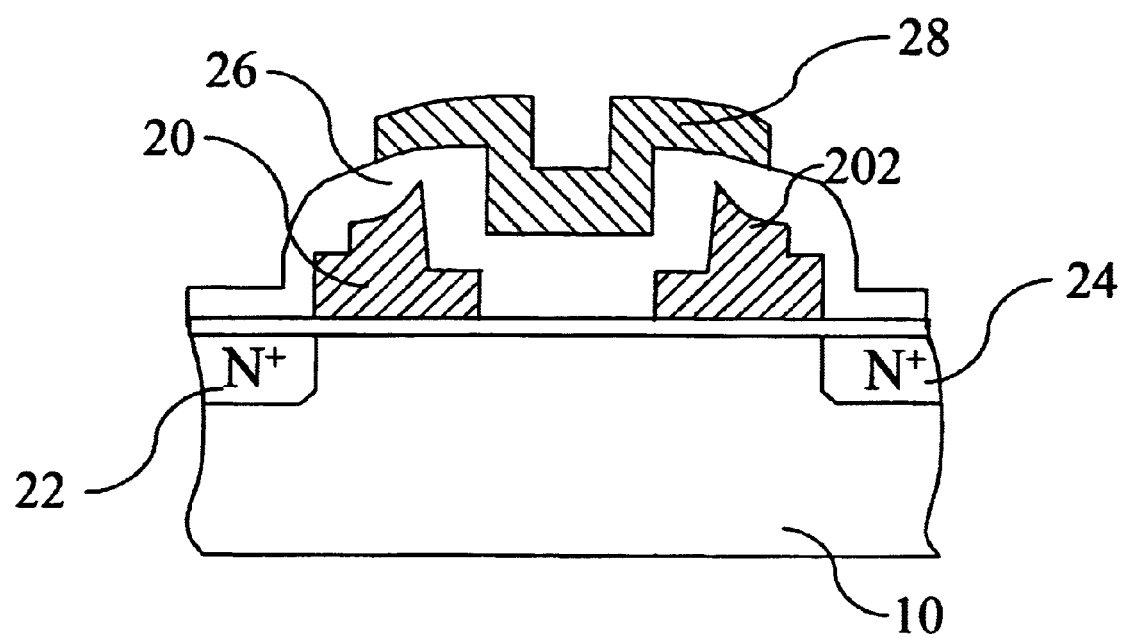

After forming the above mentioned floating gates 20, the present invention further comprises the following steps. Ion-implanting the semiconductor substrate 10 to form an ion-implanted regions for use as a source 22 and a drain 24. Following that, an insulating dielectric layer 26 is deposited on the semiconductor substrate 10 to cover the floating gates 20 and the exposed gate oxide layer 12. Lastly, a defined second polysilicon layer is formed on the insulating dielectric layer 26 for use as a control gate 28, such as shown in the FIG. 6. A flash memory structure thereby obtained.

The insulating dielectric layer 26 is made of a material selected from oxides, nitrides, and other dielectric materials or one of oxide-nitride-oxide (ONO) and nitride-oxide (NO).

Figure 5:
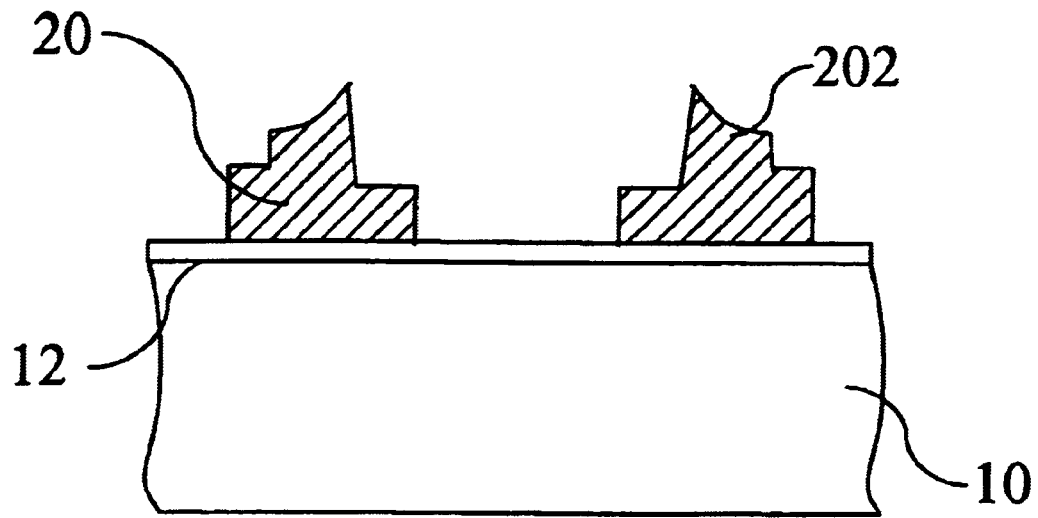
Figure 5A:
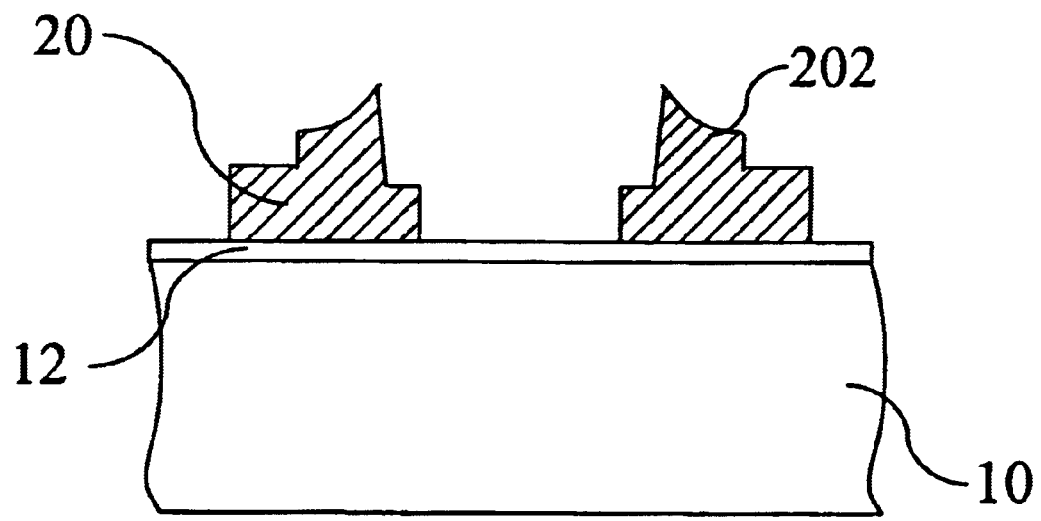
FIG. 5A is one preferred embodiment of the present invention in accordance with the FIG. 5.

In the present invention, when the deposition thickness of the second dielectric layer 16 is made thicker, the position of the sharp end structure 202 of each floating gate 20 is correspondingly changed. Comparing FIG. 5 and FIG. 5A, the present invention utilizes this method to adjust the position of the sharp end structure 202 so as to enhance the ability of the data-erasing control. Hence, the fabrication method for forming a flash memory device provided by the present invention can control the position of the sharp end structure to improve the size of the process window. Further, the control gate can easily completely cover the sharp end structure of the floating gate so as to enhance the erasing control of the flash memory. Besides, the method of the present invention can be used to manufacture stable and easily controlled channel length, the sharp end structure providing point discharging, and can achieve repeatability of the fabrication of semiconductor devices.

The forgoing description of the embodiments of the invention has been presented for purposes of illustration and description, and is not intended to be exhaustive or to limit the invention. The description was selected to best explain the principles of the invention and practical application of these principles to enable others skilled in the art to best utilize the invention in various embodiments and modifications as are suited to the particular use contemplated. It is intended that the scope of the invention not to be limited by the specification, but be defined by the claims as set forth below.

What is claimed is:

1. A fabrication method for forming a flash memory device provided with an adjustable sharp end structure of a L-shaped floating gate, said fabrication method comprising the following steps:

providing a semiconductor substrate formed with a gate oxide layer thereon;

forming a defined patterned first dielectric layer on a portion of said gate oxide layer, said first dielectric layer having a pair of opposing sidewalls;

depositing a polysilicon layer on said semiconductor substrate to cover said gate oxide layer and said first dielectric layer, said polysilicon layer forming a raised portion with a pair of sloped sidewalls over said first dielectric layer;

forming a second dielectric layer to cover said polysilicon layer, said second dielectric layer having a thickness;

etching said second dielectric layer to form a dielectric spacer on each of said sloped sidewalls of said raised portion of said polysilicon layer, said dielectric spacers being positioned with respect to said sidewalls of said first dielectric layer selectively responsive to said thickness of said second dielectric layer; and etching said polysilicon layer using each said dielectric spacer as a mask to form a respective polysilicon spacer with an upwardly projecting sloped end structure disposed in spaced relationship from a corresponding one of said sidewalls of said first dielectric layer, wherein said polysilicon spacers are used as a floating gates.

2. The fabrication method for forming a flash memory device according to claim 1, wherein the material of said first dielectric layer is selected from the group consisting of oxides, and nitrides.

3. The fabrication method for forming a flash memory device according to claim 1, wherein the material of said second dielectric layer is selected from the group consisting of oxides, and nitrides.

4. The fabrication method of said according to claim 1, wherein said defined patterned first dielectric layer is formed by using a patterned photoresist as a mask.

5. The fabrication method for forming a flash memory device according to claim 1, wherein the step of etching said polysilicon layer is an anisotropic etching process.

6. The fabrication method for forming a flash memory device according to claim 1, further comprising the step of removing said first dielectric layer subsequent to forming said polysilicon spacers to expose said portion of said gate oxide layer.

7. The fabrication method for forming a flash memory device according to claim 6, wherein the step of removing said first dielectric layer includes the step of simultaneously removing said dielectric spacers.

8. The fabrication method for forming a flash memory device according to claim 6, further comprises the following steps after removing said first dielectric layer:

performing ion implantation to said semiconductor substrate to form a doped region;

depositing an insulating dielectric layer on said semiconductor substrate to cover said floating gates and said exposed portion of said gate oxide layer; and forming a defined second polysilicon layer on said insulating dielectric layer for using as a control gate.

9. The fabrication method for forming a flash memory device according to claim 8, wherein the material of said insulating dielectric layer is selected from the group consisting of oxides, nitrides, and combinations thereof.

10. The fabrication method for forming a flash memory device according to claim 8, wherein the material of said insulating dielectric layer is selected from the group consisting of oxide-nitride-oxide (ONO) and nitride-oxide (NO).

11. The fabrication method for forming a flash memory device according to claim 8, wherein said defined second polysilicon layer is formed by using a patterned photoresist as a mask.

* * * * *